(12) United States Patent
Xu et al.

(10) Patent No.: US 10,084,470 B2
(45) Date of Patent: Sep. 25, 2018

(54) ANALOGUE-DIGITAL CONVERTER OF NON-BINARY CAPACITOR ARRAY WITH REDUNDANT BIT AND ITS CHIP

(71) Applicant: No. 24 Research Institute of China Electronics Technology Group Corporation, Chongqing (CN)

(72) Inventors: Daiguo Xu, Chongqing (CN); Shiliu Xu, Chongqing (CN); Gangyi Hu, Chongqing (CN); Guangbing Chen, Chongqing (CN); Lu Liu, Chongqing (CN)

(73) Assignee: NO. 24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 0 days.

(21) Appl. No.: 15/555,071

(22) PCT Filed: Apr. 9, 2015

(86) PCT No.: PCT/CN2015/076126
§ 371 (c)(1),
(2) Date: Aug. 31, 2017

(87) PCT Pub. No.: WO2016/149964
PCT Pub. Date: Sep. 29, 2016

(65) Prior Publication Data
US 2018/0041221 A1 Feb. 8, 2018

(30) Foreign Application Priority Data
Mar. 20, 2015 (CN) .......................... 2015 1 0125504

(51) Int. Cl.
H03M 1/12 (2006.01)
H03M 1/44 (2006.01)
H03M 1/06 (2006.01)

(52) U.S. Cl.
CPC ........... H03M 1/442 (2013.01); H03M 1/068 (2013.01); H03M 1/1245 (2013.01)

(58) Field of Classification Search
CPC ..... H03M 1/442; H03M 1/068; H03M 1/1245
(Continued)

(56) References Cited

U.S. PATENT DOCUMENTS 8,786,484 B2 * 7/2014 Cheong ............... H03M 1/0682
341/155
8,797,204 B2 * 8/2014 Yoon ....................... H03M 1/16
341/155
(Continued)

FOREIGN PATENT DOCUMENTS

CN 101098147 A 1/2008
CN 102045067 A 5/2011
(Continued)

Primary Examiner — Brian Young
(74) Attorney, Agent, or Firm — Global IP Services; Tianhua Gu

(57) ABSTRACT

An analog-to-digital converter of non-binary capacitor array with redundancy bits and its chip. The non-binary capacitor array with redundancy bits comprises a common-mode voltage, analog signal input, no less than one redundancy bit capacitor and multiple capacitors; each capacitor of capacitors with redundancy bits and multiple capacitors is connected in parallel between common-mode voltage and analog signal input and marked in a sequence from highest to lowest/lowest to highest bit; the sum of the capacitance of capacitors from the lowest bit capacitor to an random capacitor must be no less than the capacitance of the higher bit capacitor adjacent to the random capacitor. The ratio of the capacitance of each capacitor to the capacitance of unit (Continued)

capacitor is set to be positive. The capacitor array is applied into an analog-to-digital converter or fabricated as a chip.

10 Claims, 7 Drawing Sheets

(58) Field of Classification Search
USPC .......................................... 341/155, 159, 120
See application file for complete search history.

(56) References Cited

U.S. PATENT DOCUMENTS

| 9,553,602 | B1 * | 1/2017 | Wu | ......................... H03M 1/12 |
| 9,608,656 | B2 * | 3/2017 | Yuan | .................. H03M 1/1245 |

FOREIGN PATENT DOCUMENTS

| CN | 102916699 A | 2/2013 |
| CN | 103281083 A | 9/2013 |
| CN | 103929178 A | 7/2014 |
| CN | 104113341 A | 10/2014 |

\* cited by examiner

ANALOGUE-DIGITAL CONVERTER OF NON-BINARY CAPACITOR ARRAY WITH REDUNDANT BIT AND ITS CHIP

CROSS REFERENCE TO RELATED PATENT APPLICATION

The present application is the US national stage of PCT/CN2015/076126 filed on Apr. 9, 2015, which claims the priority of the Chinese patent application No. 2015101255040 filed on Mar. 20, 2015, which application is incorporated herein by reference.

TECHNOLOGY FIELD

The invention relates to analog circuits and analog and digital mixed integrated circuits, particularly to a non-binary capacitor array with redundancy bits and an analog-to-digital converter and its chip being realized by using non-binary capacitor array with redundancy bits.

BACKGROUND

As CMOS technology grows, more effort has been made in the research of successive approximation analog-to-digital converters. As to conventional successive approximation analog-to-digital converters, capacitors in the capacitor array are designed by using binary increment which features easily reconfiguration and where the output of capacitors is the result of analog-to-digital converters.

Technically, analog-to-digital converters are packaged in an IC chip, where the circuit layout must be designed in a rigorous and orderly way due to binary increment (powers of 2). The conventional one, lack of flexibility in layout design, is unable to achieve the tradeoff between speed and size because of the rigorous capacitor array. Therefore, it can not meet the requirement of high speed low power successive approximation analog-to-digital converters.

So, the capacitor array arrays in analog-to-digital converters are in need for improvement to fit in the high resolution low power technology.

SUMMARY OF THE INVENTION

It is an object of the invention to provide an analog-to-digital converter of non-binary capacitor array with redundancy bits and its chip, which features flexibility in layout design and is able to realize the tradeoff between speed and size. It can meet the requirement of high speed lower power successive approximation analog-to-digital converters.

The invention presents the following schemes to accomplish the foregoing objects of the invention:

Scheme I

A non-binary capacitor array with redundancy bits is used to sample analog signals, wherein, the non-binary capacitor array consists of a common-mode voltage end, analog signal input, no less than one capacitor with redundancy bit and multiple capacitors. All capacitors in no less than one redundancy bit capacitor and multiple capacitors are connected in parallel between common-mode voltage end and analog signal input. All capacitors between common-mode voltage end and analog signal input are marked in a sequence from highest bit to lowest bit/from lowest to highest bit. And the sum of the capacitance of capacitors from the lowest bit capacitor to an random capacitor must be no less than the capacitance of the higher bit capacitor adjacent to the random capacitor. The ratio of the capacitance of each capacitor to the capacitance of unit capacitor is set to be positive.

The non-binary capacitor array with redundancy bits is optimized,

Wherein, the capacitance of each capacitor with redundancy bits is no less than the minimum capacitance and no larger than the maximum capacitance of multiple capacitors;

And the number of capacitors with redundancy bits is less than that of multiple capacitors;

And the two ends of capacitors with redundancy bits are respectively connected to the common-mode voltage ends during analog sampling. And both ends of each capacitor from multiple capacitors are respectively connected to the common-mode voltage end and to the analog signal input during analog sampling.

And the two ends of the capacitor with redundancy bits and the two ends of each of multiple capacitors take turns to be connected to the common-mode voltage end and the analog signal input during analog sampling.

Scheme II

Scheme I is applied to analog-to-digital converters in ways that obtain a non-binary successive approximation analog-to-digital converter with redundancy bits. The circuit comprises a successive approximation switch, a non-binary capacitor array with redundancy bits as mentioned in Scheme I, a comparator, a reconfiguration module and an overflow detection module, wherein a non-binary capacitor array with redundancy bits is used to sample analog signals and obtain a corresponding sample signal;

a comparator, with its input end being connected to the non-binary capacitor array and output end being connected to the common-mode voltage end through a successive approximation switch, is used to compare sample signals from the non-binary capacitor array in successive approximation way and output binary digital signals;

a reconfiguration module, with its input end being connected to the output end of the comparator, is employed for addition reconfiguration of digital signals and outputs binary digital conversion signals;

a overflow detection module, with its input end being connected to the output end of the reconfiguration module, is used to calibrate the output after the higher bit and lower bit overflow detection of digital conversion signals.

Scheme II is optimized wherein the reconfiguration module is specified as a full-adder.

Scheme III

Scheme I and II are applied to integrated chip, namely, the non-binary capacitor array with redundancy bits is applied to analog-to-digital conversion chip, in the other word, the non-binary successive approximation analog-to-digital converter with redundancy bits is fabricated as a chip.

To sum up, compared with the conventional circuit, the present invention has the following advantages:

1. For CDAC capacitor design, the capacitance of each capacitor corresponding to each digital code is more flexible in ways that realize the tradeoff design between speed, power and size.

2. As the capacitance of each capacitor unit is flexible, it is easier to design the placement and size of each capacitor according the requirement of layout and technology.

3. Overflow detection module works to solve the problem of non-monotony resulting from upper limit and lower limit overflow and improve the reliability of the circuit.

4. Reconfiguration algorithm is proposed to explain how the successive approximation analog-to-digital converter works, which is helpful for further research on the analog-to-digital converters.

DESCRIPTION OF THE DRAWINGS

To better understand the objects, technologies and advantages of the invention, the accompanying drawings are referred to for further description, wherein.

Figure 1:
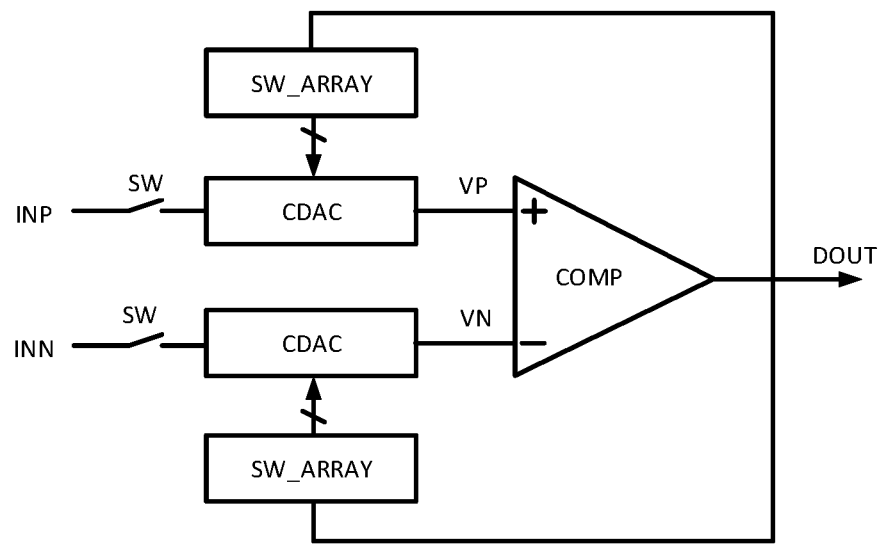
FIG. 1 is a schematic circuit diagram of the successive approximation analog-to-digital converter.

Wherein, you may refer to non-binary capacitor array with redundancy bits 10, comparator 20, successive approximation switch 30, reconfiguration module 40 and overflow detection module 50.

SPECIFIC MODE FOR CARRYING OUT THE INVENTION

Hereinafter, the preferred embodiments of the invention will be described using the drawings. It should be understood that the following embodiments are provided just for describing the invention, instead of limiting the property protection scope of the invention.

Embodiment 1

FIG. 1 is showing a schematic diagram of a capacitor array CDAC of a successive approximation analog-to-digital converter without redundancy bits. According to the theory of successive approximation analog-to-digital converters, if a successive approximation converters has n bits, then $K_0=K_1=1$, $K_2=2^1$, $K_3=2^2$, ..., $K_{(n-2)}=2^{n-3}$, $K_{(n-1)}=2^{n-2}$, wherein, C denotes the capacitance of unit capacitor. As shown in FIG. 1, the way the circuit works is described as follows: when capacitor array CDAC works to sample, switch S1 is switched on, the upper plate of the capacitor array is connected to the common-mode voltage VCM. At the same time, switch SW is switched on, the lower plate of the capacitor array is connected to the input signals INP/INN. After sampling, S1 is switched off, SW is switched off. Then the successive approximation switch SW_ARRAY is connected to the common-mode voltage VCM and the first comparison is carried out. Hereafter, the switches of capacitors from capacitor $K_{(n-1)}C$ to $K_1C$ take turns to be switched based on comparison results till the completion of successive approximation course. During the course, the switch corresponding to the capacitor $K_0C$ is connected to the common-mode voltage.

Then reconfiguration is performed in digital domain during the successive approximation. For better understanding of the reconfiguration, the binary output result is converted into corresponding octal number. Therefore, $$DOUT=2^{n-1}+2^{n-2}S_{(n-1)}+2^{n-3}S_{(n-2)}+ \ldots +2^2S_3+2^1S_2+S_1+0.5S_0 \quad (1)$$

Wherein, $S_i$ (i=0, 1, 2, ..., n-2, n-1) equals to either 1 or -1 after the comparison result. In order to correspond to the output, equation (2) is expressed as:

$$S_i=2D_{i-1} \quad (2)$$

Wherein, $D_i$ (i=0, 1, 2, ..., n-2, n-1) equals to either 0 or 1. According to equation (2), equation (1) is simplified as:

$$DOUT=2^{n-1}D_{(n-1)}+2^{n-2}S_{(n-2)}+ \ldots +2^2D_2+2^1D_1+D_0+0.5 \quad (3)$$

Due to the decimal system, equation (3) is simplified as:

$$DOUT=2^{n-1}D_{(n-1)}+2^{n-2}S_{(n-2)}+ \ldots +2^2D_2+2^1D_1+D_0 \quad (4)$$

Wherein, $D_i$ (i=0, 1, 2, ..., n-2, n-1) is the final output code of the n bit analog-to-digital converter.

Figure 2:
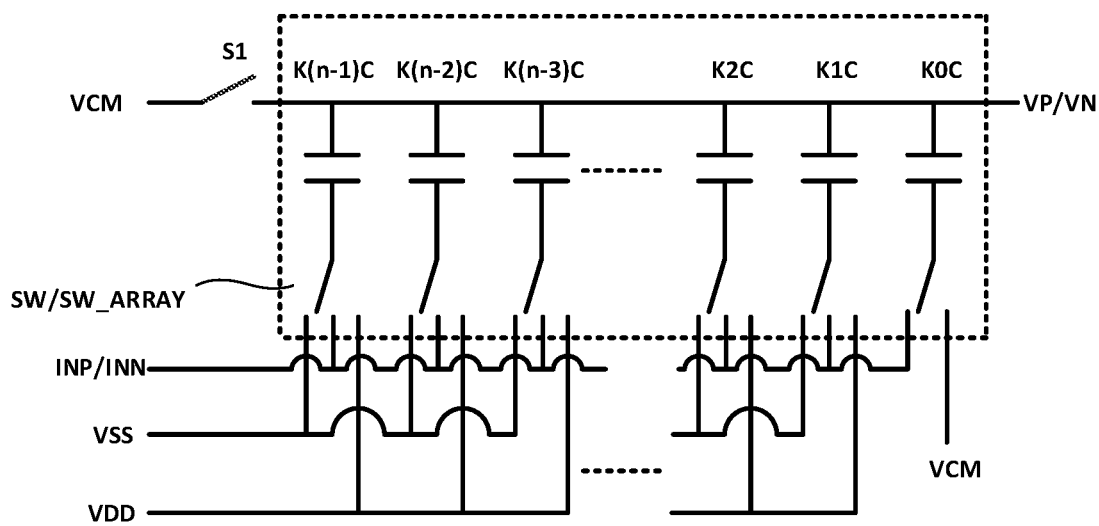
FIG. 2 is a CDAC schematic circuit diagram of the binary successive approximation analog-to-digital converter without redundancy bits.

FIG. 2 is showing a schematic diagram of a successive approximation analog-to-digital converter without redundancy bits. It should be noted that as shown in FIG. 1, the output of the comparator of the successive approximation analog-to-digital converter without redundancy bits is the final output result of the converter, as we know.

Figure 3:
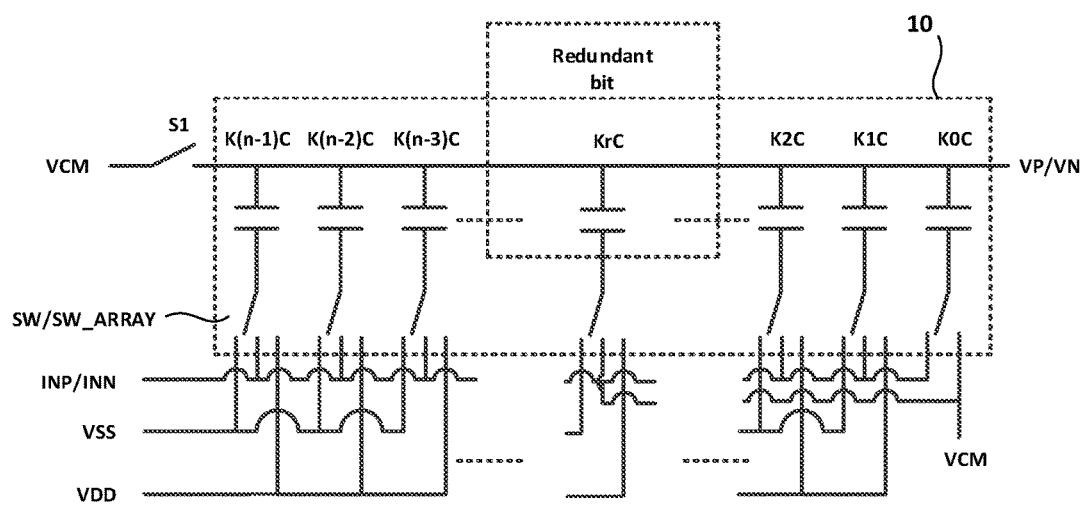
FIG. 3 is a CDAC schematic circuit diagram of the binary successive approximation analog-to-digital converter with redundancy bits.

FIG. 3 is showing a schematic diagram of the capacitor array CDAC of a binary successive approximation analog-to-digital converter with redundancy bits. Wherein, the capacitor array CDAC consists of n+1 capacitors, including n non-redundancy bit capacitors and 1 redundancy bit capacitor. The redundancy bit capacitor $K_rC$ is presented wherein $K_0=K_1=1$, $K_2=2^1$, $K_3=2^2$, ..., $K_r=2^r$, ..., $K_{(n-2)}=2^{n-3}$, $K_{(n-1)}=2^{n-2}$ (1<r<n-1). As shown in FIG. 3, according the theory of successive approximation analog-to-digital converter, when the capacitor array CDAC works to sample, switch S1 is on, and the upper plate of the capacitor array is connected to the common-mode voltage VCM. At the same time, switch SW is on, the lower plate of the capacitor array is connected to the input signal INP/INN, the redundancy bit capacitor $K_rC$ is connected to common-mode voltage VCM. After sampling, switch S1 is off and switch SW is off, and the successive approximation switch SW_ARRAY is connected to the common-mode voltage VCM. First comparison is performed. Hereafter, the switches of capacitors from capacitor $K_{(n-1)}C$ to $K_1C$ take turns to be switched based on comparison results till the completion of successive approximation course. During the course, the switch corresponding to the capacitor $K_0C$ is connected to the common-mode voltage VCM.

At the same time, reconfiguration is performed in digital domain during the successive approximation. For better understanding of the reconfiguration, the binary output result is converted into corresponding octal number. Then, $$DOUT=2^{n-1}+2^{n-2}S_{(n-1)}+2^{n-3}S_{(n-2)}+ \ldots +2^rS_r+ \ldots +2^2S_3+2^1S_2+S_1+0.5S_0 \quad (5)$$

Wherein, $S_i$ (i=0, 1, 2, ..., r, ..., n−2, n−1) is either −1 or 1 based on each comparison result. According to equation (2), equation (5) is simplified as:

$$DOUT=2^{n-1}D_{(n-1)}+2^{n-2}S_{(n-2)}+\ldots+2^2D_2+2^1D_1+D_0+2^rD_r-2^r \quad (6)$$

Figure 4:
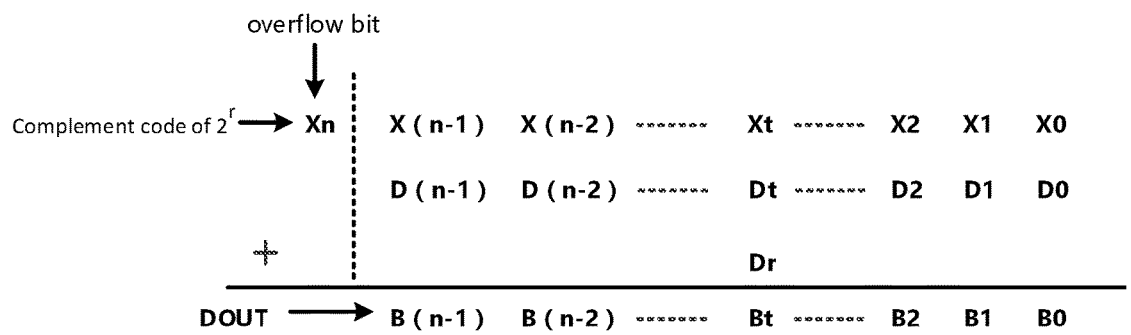
FIG. 4 is a calculation chart of reconfiguration for the binary successive approximation analog-to-digital converter with redundancy bits.

According to 1<r<n−1, the capacitor array CDAC is a binary capacitor array. Here comes the equation $K_rC=K_rC$, wherein $K_rC$ is one of the capacitors without redundancy bits, then the reconfiguration algorithm of equation (6) is shown as FIG. 4.

Based on analysis above, $K_0=K_1=1$, $K_2$, $K_3$, ..., $K_r$, ..., $K_{(n-2)}$, $K_{(n-1)}$ are natural numbers (Generally, they are positive integers, but natural numbers are employed for better understanding), and $K_j \leq K_{(j-1)}+K_{(j-2)}+\ldots+K_1+K_0$ (1≤j≤n−1). Therefore, the capacitor $K_0C$, $K_1C$, $K_2C$, $K_3C$, ..., $K_rC$, ..., $K_{(n-2)}C$, $K_{(n-1)}C$ in the capacitor array CDAC can be set in natural number but binary way. So the capacitor array CDAC can be flexible to design various combinations of capacitor arrays. The reconfiguration algorithm of capacitor array is performed in natural number way as follows:

As to the relation $K_j \leq K_{(j-1)}+K_{(j-2)}+\ldots+K_1+K_0$ (1≤j≤n−1), j denotes the ordinal numbers of capacitors from highest bit to lowest bit or from lowest bit to highest bit. For example, 10 capacitors in a capacitor array (including redundancy bit capacitor) are sorted and marked by the sequence of the highest bit capacitor, second highest bit capacitor, third highest bit capacitor, ... ninth highest bit capacitor, lowest bit capacitor or the sequence of the lowest bit capacitor, second lowest bit capacitor, third lowest bit capacitor, ... ninth lowest bit capacitor, highest bit capacitor. Wherein, if the sequence is from highest to lowest bit capacitor, then the capacitance of the second highest capacitor must be no more than the total capacitance of the capacitors from the third highest bit capacitor to the lowest bit capacitor. (Likewise, it works the same if the sequence is from lowest to highest bit capacitor). Generally speaking, the sum of the capacitance of capacitors from the lowest bit capacitor to an random capacitor must be no less than the capacitance of the higher bit capacitor adjacent to the random capacitor.

Specifically, based on the analysis above, equation (7) is expressed as follows:

$$DOUT=2^{n-1}+K^{(n-1)}S_{(n-1)}+K^{(n-2)}S_{(n-2)}+\ldots+K^rS_r+\ldots+K^3S_3+K^2S_2+K^1S_1+0.5S_0 \quad (7)$$

Wherein, $S_i$ (i=0, 1, 2, ..., r, ..., n−2, n−1) is either −1 or 1. According to equation (2) and (7), equation (8) is simplified as:

$$DOUT=2K_{(n-1)}D_{(n-1)}+2K_{(n-2)}D_{(n-2)}+\ldots+2K_rD_r+\ldots+2K_3D_3+2K_2D_2+2K_1D_1+D_02^{n-1}-K_{(n-1)}-K_{(n-2)}-\ldots-K_r-\ldots-K_3-K_2-K_1-1 \quad (8)$$

Figure 5:
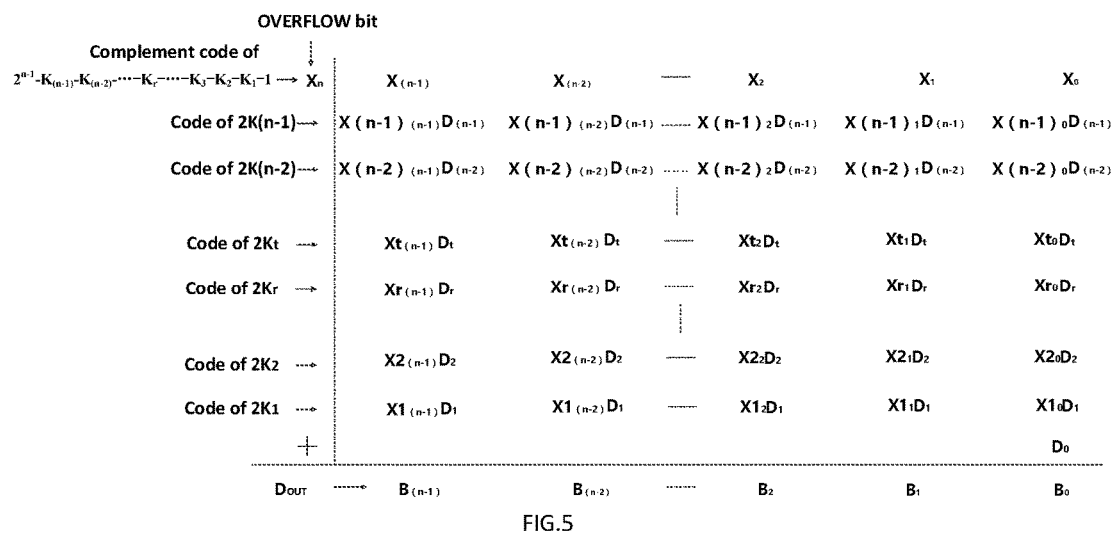
FIG. 5 is a calculation chart of reconfiguration for the non-binary successive approximation analog-to-digital converter with redundancy bits.

The reconfiguration of equation (8) is shown as in FIG. 5. According to equation (8), the coefficient $2K_i$ (i=0, 1, 2, ..., r, ..., n−2, n−1) of $D_i$ (i=0, 1, 2, ..., r, ..., n−2, n−1) can be expressed by the sum of power function of 2. As long as the capacitance of each capacitor in capacitor array CDAC is set, the expression of $2K_i$ (i=0, 1, 2, ..., r, ..., n−2, n−1) is assured. Namely, except $D_i$ (i=0, 1, 2, ..., r, ..., n−2, n−1), other coefficients are assured as shown in FIG. 5. The reconfiguration unit REBULDER is designed according to the description above.

Figure 6:
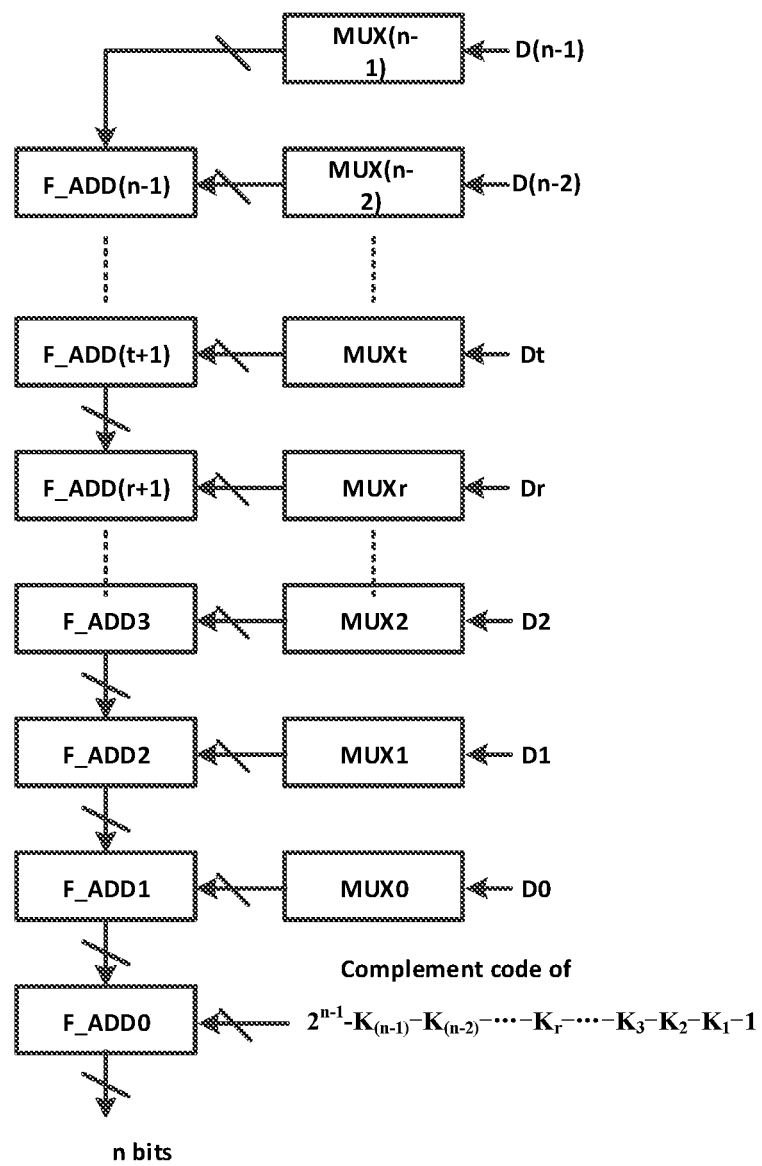
FIG. 6 is a schematic diagram of the reconfiguration unit REBUILDER.

The schematic diagram of the reconfiguration unit REBUILDER is shown in FIG. 6, wherein F_ADD is a full adder. How the MUXi (i=0, 1, 2, ... r, ..., n−2, n−1) unit works is described as follows: when $D_i$ (i=0, 1, 2, ... r, ..., n−2, n−1) is 0, the output is 0; when $D_i$ (i=0, 1, 2, ... r, ..., n−2, n−1) is 1, the output is the coefficient of $2K_i$ (i=0, 1, 2, ... r, ..., n−2, n−1). Likewise, as successive comparison goes, each comparison result is successively added to each other with overflow bits being removed in ways that obtain n-bit digital code.

Figure 7:
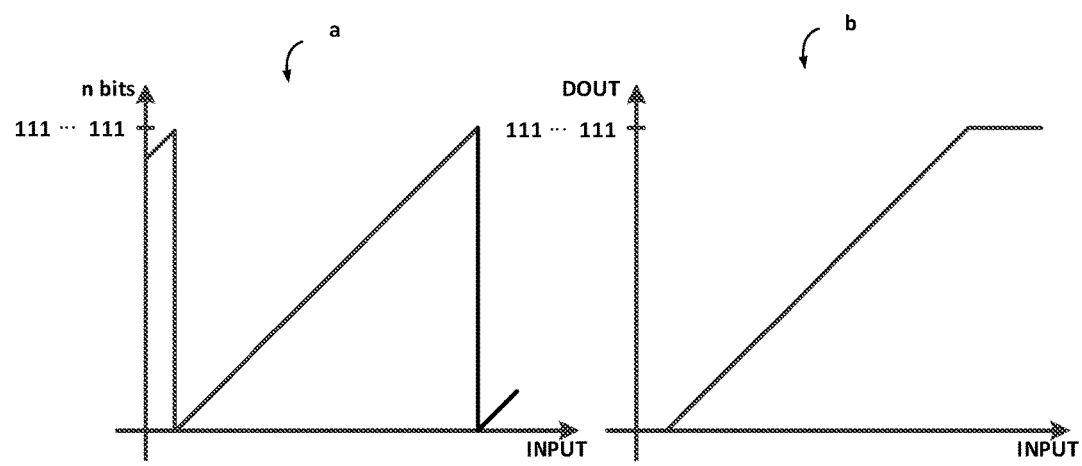
FIG. 7 is showing output graphs before and after overflow detection.

Furthermore, as offsets exist in circuit, the added result may have overflow issue after the addition of the reconfiguration unit REBUILDER. FIG. 7.a is showing the graph of the output before overflow detection, wherein without upward overflow, when n bits digital code from REBUILDER is less than a certain value, a larger value is obtained which should have been a smaller one; due to upward overflow, when n bits digital code from REBUILDER is larger than a certain value, a smaller value is obtained which should have been a larger one. FIG. 7.b is showing the graph of the output after overflow detection which is required to solve the problem mentioned above. When n bits digital code is lower than the lower limit of reconfiguration detection, DOUT equals to 0; when n bits digital code is larger than the upper limit of reconfiguration detection, DOUT equals to 1; when n bits digital code is larger than the lower limit and lower than the upper limit, DOUT is the output of n bits digital code from REBUILDER.

Figure 8:
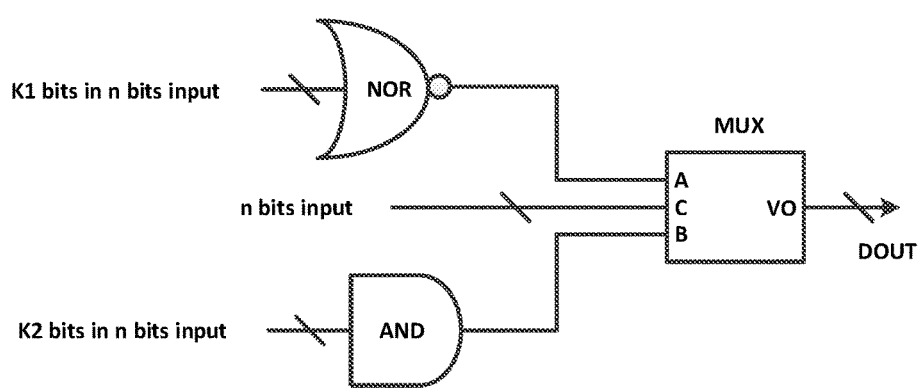
FIG. 8 is a schematic diagram of overflow detection module OVERFLOW DETECT.

FIG. 8 is showing a schematic diagram of overflow detection module. The lower limit is defined where some bits of the n bits digital code from REBUILDER are 0; the upper limit is defined where some bits of the n bits digital code from REBUILDER are 1. When the n bits digital code is no larger than the lower limit, the voltage at the input A of MUX unit must be high level, the voltage at B is low level, the output of MUX unit is n bit low level digital code; When the n bits digital code is no less than the upper limit, the voltage at the input A of MUX unit is low level, the voltage at B is high level, the output of MUX unit is n bit high level digital code; when the n bits digital code is lower than the upper limit and larger than the lower limit, the voltages at A and B are low levels and the output of MUX unit is the n bits input digital code. Then the overflow detection is performed when the voltages at neither A nor B are high levels. It should be understood that the description above is only the mode of carrying out the overflow detection. Practically, if the capacitor array features various capacitances, the overflow detection must be adjusted correspondingly sharing the same theory. Besides, other successive detections are available as long as highest and lowest bit detection works. Generally speaking, as long as the overflow detection works, no less than one structure works as mentioned above.

It should be understood that, for embodiment 1, the operation scheme is shown in FIG. 3, wherein $K_0=K_1=1$, $K_2$, $K_3$, ..., $K_r$, ... $K_{(n-2)}$, $K_{(n-1)}$ are natural numbers, $K_j \leq K_{(j-1)}+K_{(j-2)}+\ldots+K_1+K_0$ (1≤j≤n−1), the input voltage range is ±(VDD−VSS).

To sum up, as shown in FIG. 3, the invention is presented to provide a non-binary capacitor array with redundancy bits 10 to sample analog signals. Wherein, the non-binary capacitor array consists of a common-mode voltage end, analog signal input, no less than one capacitor with redundancy bits and multiple capacitors. All capacitors in no less than one redundancy bit capacitor and multiple capacitors are connected in parallel between common-mode voltage end and analog signal input. All capacitors between common-mode voltage end and analog signal input are marked in a sequence from highest bit to lowest bit/from lowest to highest bit. And the sum of the capacitance of capacitors from the lowest bit capacitor to a random capacitor must be no less than the capacitance of the higher bit capacitor adjacent to the random capacitor. The ratio of the capacitance of each capacitor to the capacitance of unit capacitor is set to be positive.

Wherein, the capacitance of each capacitor with redundancy bits is no less than the minimum capacitance and no larger than the maximum capacitance of multiple capacitors; And the number of capacitors with redundancy bits is less than that of multiple capacitors;

And the two ends of capacitors with redundancy bits are respectively connected to the common-mode voltage ends during analog sampling. And both ends of each capacitor from multiple capacitors are respectively connected to the common-mode voltage end and to the analog signal input during analog sampling.

Embodiment 2

Figure 9:
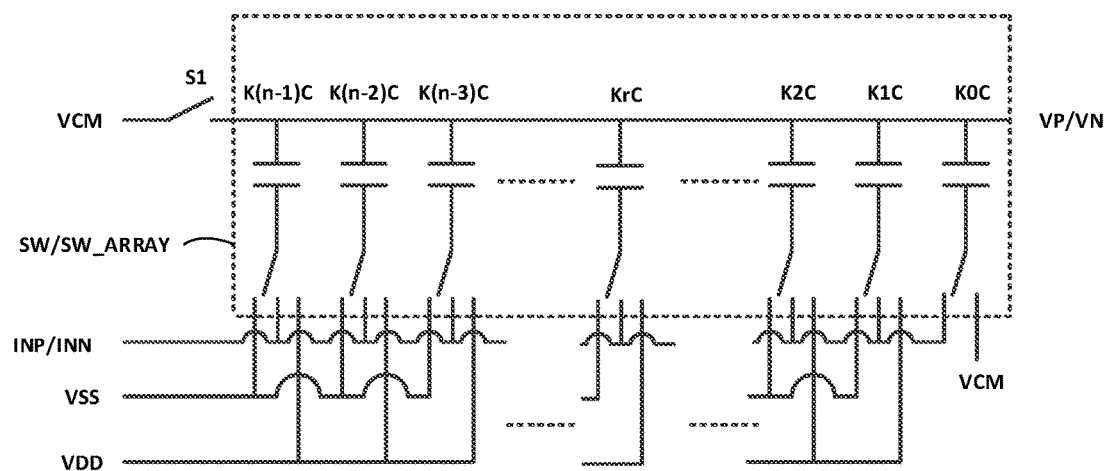
FIG. 9 is a schematic diagram of non-binary capacitor array with redundancy bits CDAC in example II.

A non-binary capacitor array with redundancy bits is provided as shown in FIG. 9. Wherein, $K_0=K_1=1 \circ K_2$, $K_3, \ldots, K_r, \ldots, K_{(n-2)}, K_{(n-1)}$ are natural numbers and $K_j \leq K_{(j-1)} + K_{(j-2)} + \ldots + K_1 + K_0$ ($1 \leq j \leq n-1$). Compared with the non-binary capacitor array with redundancy bits in Embodiment 1, the operation scheme of embodiment 2 is described as follows: when capacitor array CDAC works to sample, switch S1 is switched on, the upper plate of the capacitor array is connected to the common-mode voltage VCM. At the same time, switch SW is switched on, the lower plate of the capacitor array is connected to the input signals INP/INN. The capacitor with redundancy bits $K_rC$ is simultaneously sampling. After sampling, S1 is switched off, SW is switched off. Then the successive approximation switch SW_ARRAY is connected to the common-mode voltage VCM and the first comparison is carried out. Hereafter, the switches of capacitors from capacitor $K_{(n-1)}C$ to $K_1C$ take turns to be switched based on comparison results till the completion of successive approximation course. During the course, the switch corresponding to the capacitor $K_0C$ is connected to the common-mode voltage VCM. The reconfiguration and overflow detection work the same as in embodiment 1. For embodiment 2, the input voltage range is expressed as follow:

$$\pm(VDD-VSS)(K_0+K_1+K_2+K_3+ \ldots +K_{(n-2)}+K_{(n-1)})/ \\ (K_0+K_1+K_2+K_3+ \ldots +K_r+ \ldots +K_{(n-2)}+K_{(n-1)}) \quad (9)$$

Embodiment 3

Figure 10:
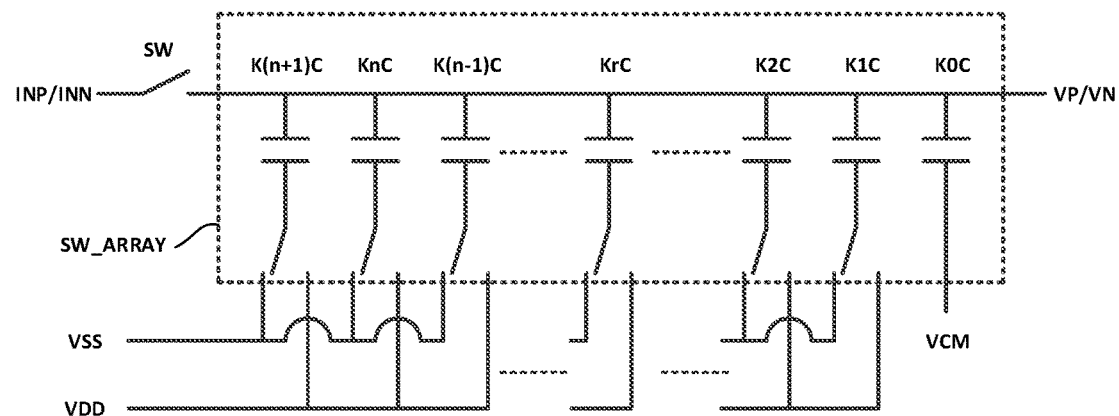
FIG. 10 is a schematic diagram of non-binary capacitor array with redundancy bits CDAC in example III.

Furthermore, a schematic diagram of another non-binary capacitor array with redundancy bits is shown in FIG. 10. Wherein K0=K1=1. K2, K3, ..., Kr, ..., K(n-2), K(n-1) are natural numbers and $K_j \leq K_{(j-1)} + K_{(j-2)} + \ldots + K_1 + K_0$ ($1 \leq j \leq n-1$). Compared with the non-binary capacitor array with redundancy bits in Embodiment 1, the operation scheme of embodiment 3 is described as follows: when capacitor array CDAC works to sample, switch SW is switched on, the upper plate of the capacitor array is connected to input signal INP/INN, the redundancy bit capacitor $K_rC$ is simultaneously sampling. At the same time, the lower plate of the capacitor array is connected to the common-mode voltage VCM through the successive approximation switch SW_ARRAY. After sampling, SW is switched off. The switch SW_ARRAY remains to be connected to common-mode voltage VCM for the first comparison. Hereafter, the switches of capacitors from capacitor $K_{(n-1)}C$ to $K_1C$ take turns to be switched according to comparison results till the completion of successive approximation course. During the course, the switch of the capacitor K0C remains to be connected to the common-mode voltage VCM. The reconfiguration and overflow detection work the same as in embodiment 1. It should be noted that the input voltage range of embodiment 3 is expressed as follow:

$$\pm(VDD-VSS)(K_0+K_1+K_2+K_3+ \ldots +K_{(n-2)}+K_{(n-1)})/ \\ (K_0+K_1+K_2+K_3+ \ldots +K_r+ \ldots +K_{(n-2)}+K_{(n-1)}) \quad (10)$$

It should be understood that the non-binary capacitor array with redundancy bits 10 may features more than one redundancy bit capacitors. The schemes, operation principles and overflow detection work the same for the non-binary capacitor array with multiple redundancy bit capacitors.

To be more specific, compared with that in embodiment 1, the capacitor array in embodiment 2 and 3 feature no less than one redundancy bit capacitor and multiple capacitors with both ends of each capacitor being connected to the common-mode voltage and the analog signal input during analog sampling.

Embodiment 4

Figure 11:
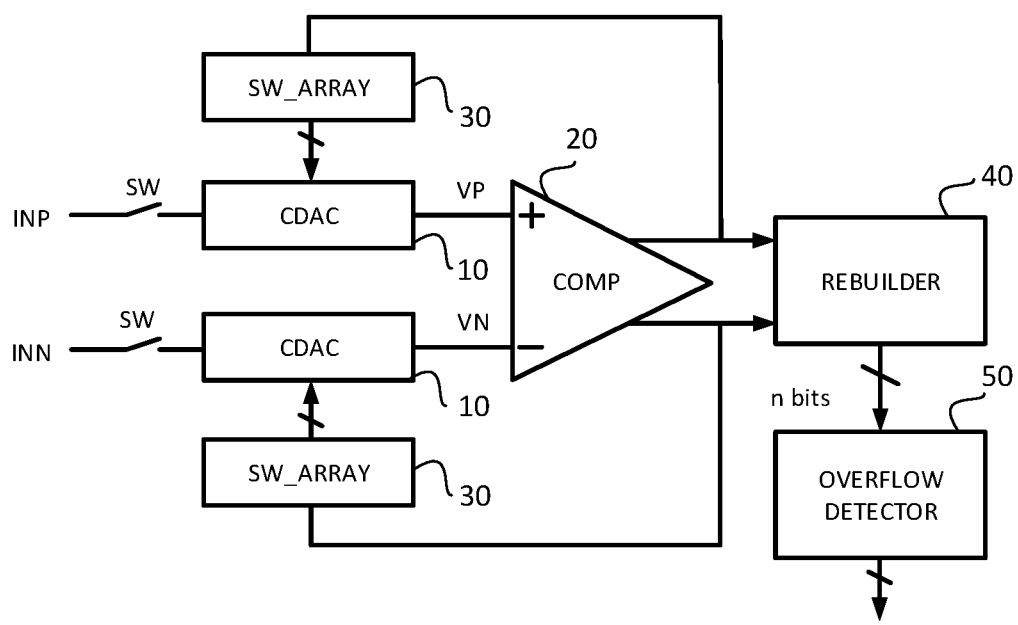
FIG. 11 is a schematic diagram of non-binary successive approximation analog-to-digital converter with redundancy bits.

Furthermore, the schemes of embodiment 1, 2 and 3 can be applied into a successive approximation converter in a way that obtains a non-binary successive approximation converter with redundancy bits. As shown in FIG. 11, the non-binary successive approximation converter with redundancy bits comprises a non-binary capacitor array with redundancy bits 10 as mentioned in scheme II and III and successive comparison switch, comparator 20, successive approximation switch 30, reconfiguration module 40 and overflow detection module 50. The non-binary capacitor array with redundancy bits 10 is used to sample and obtain analog signals; the input end of the comparator 20 is connected to the non-binary capacitor array and the output end of the comparator 20 is connected to the common-mode voltage through the successive approximation switch 30. The comparator 20 is used for successive approximation comparison of output signals from the non-binary capacitor array and outputs binary digital signals; the input end of the reconfiguration module 40 is connected to the output end of the comparator 20. The reconfiguration module 40 is used for addition reconfiguration of the digital signals and outputs binary digital conversion signals. The input end of the overflow detection module 50 is connected to the output end of the reconfiguration module 40; the overflow detection module 50 is used to detect the highest bit overflow and the lowest bit overflow of the output digital conversion signals from reconfiguration module 40 and to correct the output.

Furthermore, the non-binary capacitor array with redundancy bits in embodiment 1 and 3 can be applied into analog-to-digital converter in ways that fabricate an analog-to-digital converter chip of non-binary capacitor array with redundancy bits, even an IC chip.

To sum up, the invention has following advantages:

1. For CDAC capacitor design, the capacitance of each capacitor corresponding to each digital code is more flexible in ways that realize the tradeoff design between speed, power and size.

2. As the capacitance of each capacitor unit is flexible, it is easier for the layout design, wherein the placement of each capacitor can be easily managed and the size of each capacitor can be determined according specific process.

3. The invention employs a flexible reconfiguration algorithm. The requirement that the ratio of the capacitance of each capacitor group to unit capacitance is positive is enough and the requirement of the powers of 2 is no longer necessary. So the capacitance of capacitors can be flexible in ways that provide flexibility for layout design. The technologists in the field do not need to design layout keeping the limitations of conventional binary capacitor array in mind. They are free to design the capacitance of capacitors according to the requirement of layout size and shape.

4. Overflow detection module is employed to avoid the non-monotony issue resulting from upper and lower limit overflow in a way that improves the reliability.

5. Reconfiguration algorithm is proposed to explain how the successive approximation analog-to-digital converter works, which is helpful for further research on the analog-to-digital converters The foregoing preferred embodiments are provided to describe, not to limit, technical approaches in the invention. Obviously, bearing the essence and concept of the invention, technologists in this field can make various changes and redesigns to the invention. It should be understood that those changes and redesigns are also covered by claims of the invention, if they are with the same purpose and within the same scope of the present invention.

What is claimed is:

1. A non-binary capacitor array with redundancy bits for analog sampling comprising:

a common-mode voltage, analog signal input, no less than one capacitor with redundancy bits and a multiple capacitors; wherein all capacitors of said no less than one capacitor with redundancy bits and the multiple capacitors are connected in parallel between common-mode voltage and analog signal input and marked in a sequence from high to low bit or low to high bit;

the sum of the capacitance of capacitors from a lowest bit capacitor to a random capacitor must be no less than the capacitance of a higher bit capacitor adjacent to the random capacitor;

the ratio of the capacitance of each capacitor to the capacitance of an unit capacitor is set to be positive;

the capacitance of each capacitor with redundancy bits is no less than the minimum capacitance among the multiple capacitors and no larger than the maximum capacitance among the multiple capacitors.

2. The non-binary capacitor array with redundancy bits according to claim 1, characterized in that the number of said no less than one capacitor with redundancy bits is less than the number of said multiple capacitors.

3. The non-binary capacitor array with redundancy bits according to claim 1, characterized in that; the two ends of said capacitor with redundancy bits are respectively connected to the common-mode voltage during the analog sampling; and both ends of each capacitor from said multiple capacitors are respectively connected to the common-mode voltage and to the analog signal input during the analog sampling.

4. The non-binary capacitor array with redundancy bits according to claim 1, characterized in that each capacitor of said capacitor with redundancy bits and said multiple capacitors take turns to be connected to the common-mode voltage and the analog signal input during the analog sampling.

5. A non-binary successive approximation analog-to-digital converter with redundancy bits, characterized in that including a successive approximation switch, a non-binary capacitor array with redundancy bits, a comparator, a reconfiguration module and an overflow detection module, wherein:

said non-binary capacitor array with redundancy bits, according to claim 1 is used to sample analog signals and obtain a corresponding sample signals;

the input end of said comparator is connected to the non-binary capacitor array and the output end of said comparator is connected to a common-mode voltage through said successive approximation switch; said comparator is used to compare the sample signals from the non-binary capacitor array in the manner of successive approximation and output binary digital signals;

the input end of said reconfiguration module is connected to the output end of the comparator; said reconfiguration module is used to carry out the addition reconfiguration for the digital signals and output binary digital conversion signals;

the input end of said overflow detection module is connected to the output end of said reconfiguration module; said overflow detection module is used to detect the highest bit overflow and the lowest bit overflow of the output digital conversion signals from the reconfiguration module and to correct the output.

6. The non-binary successive approximation analog-to-digital converter with redundancy bits according to claim 5, characterized in that; said reconfiguration module is a full adder.

7. An analog-to-digital converter chip, characterized in that, featuring said non-binary capacitor array according to claim 1.

8. An analog-to-digital converter chip, characterized in that, featuring said non-binary successive approximation analog-to-digital converter with redundancy bits according to claim 5.

9. The non-binary capacitor array with redundancy bits according to claim 2, characterized in that the two ends of said capacitor with redundancy bits are respectively connected to the common-mode voltage during analog sampling; and both ends of each capacitor from said multiple capacitors are respectively connected to the common-mode voltage and to the analog signal input during the analog sampling.

10. The non-binary capacitor array with redundancy bits according to claim 2, characterized in that each capacitor of said capacitor with said redundancy bits and multiple capacitors take turns to be connected to the common-mode voltage and the analog signal input during the analog sampling.

* * * * *